United States Patent
Iguchi

(10) Patent No.: US 7,274,081 B2
(45) Date of Patent: Sep. 25, 2007

(54) FRONT-ILLUMINATED-TYPE PHOTODIODE ARRAY

(75) Inventor: Yasuhiro Iguchi, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 58 days.

(21) Appl. No.: 11/072,572

(22) Filed: Mar. 3, 2005

(65) Prior Publication Data

US 2005/0194654 A1 Sep. 8, 2005

(30) Foreign Application Priority Data

Mar. 3, 2004 (JP) .............................. 2004-058482

(51) Int. Cl.
*H01L 31/0352* (2006.01)
(52) U.S. Cl. ...................... 257/446; 257/443; 257/461; 257/184
(58) Field of Classification Search ................ 257/461, 257/443, 446
See application file for complete search history.

(56) References Cited

U.S. PATENT DOCUMENTS

| | | | |
|---|---|---|---|
| 6,518,638 B1 * | 2/2003 | Kuhara et al. | ............... 257/431 |
| 6,521,968 B2 * | 2/2003 | Kuhara et al. | ............... 257/461 |
| 2004/0038443 A1 | 2/2004 | Jiao | |
| 2005/0199976 A1 | 9/2005 | Iguchi | |

FOREIGN PATENT DOCUMENTS

| | | | |
|---|---|---|---|
| JP | 63144564 A | * | 6/1988 |
| JP | 04293264 A | * | 10/1992 |
| JP | 2001-144278 | | 5/2001 |
| JP | 2001-352094 | | 12/2001 |

* cited by examiner

Primary Examiner—Jerome Jackson
(74) Attorney, Agent, or Firm—Fish & Richardson P.C.

(57) ABSTRACT

A front-illuminated-type photodiode array comprises (a) a first-electroconductive-type semiconductor substrate, (b) a first-electroconductive-type electrode placed at the rear-face side of the semi-conductor substrate, (c) a first-electroconductive-type absorption layer formed at the front-face side of the semiconductor substrate, (d) a plurality of second-electroconductive-type regions formed from the surface of the absorption layer to a certain distance into the absorption layer such that the regions are arranged one- or two-dimensionally, (e) a second-electroconductive-type electrode provided at part of each of the second-electroconductive-type regions, (f) an antireflective coating that covers the top surface other than the individual second-electroconductive-type electrodes and that is for preventing reflection of an incoming lightwave, and (g) at least one leakage-light-wave-absorbing layer that is provided between the first-electroconductive-type electrode and the absorption layer and that has an absorption edge wavelength, $\lambda_{ga}$, equal to or longer than the absorption edge wavelength, $\lambda_{gr}$, of the absorption layer ($\lambda_{ga} \geq \lambda_{gr}$).

6 Claims, 11 Drawing Sheets

PRIOR ART

Present Invention (Above type)

Example 1

Example 2

FIG. 11        Example 2
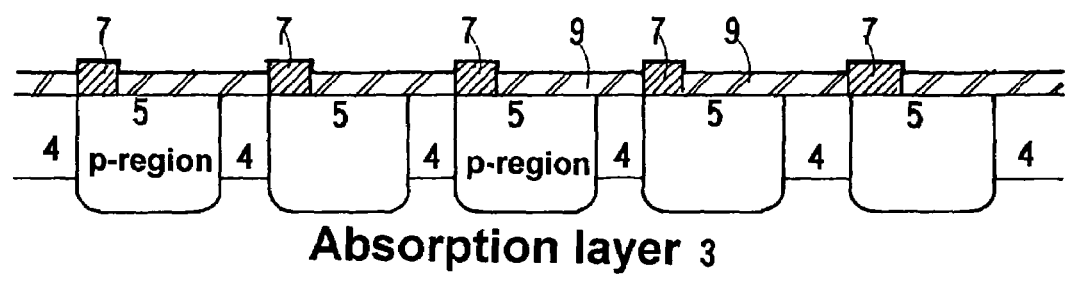

FRONT-ILLUMINATED-TYPE PHOTODIODE ARRAY

BACKGROUND OF THE INVENTION

1. Field of the Invention

The present invention relates both to a front-illuminated-type photodiode array in which a plurality of photodiode units for optical communication are unified and to a front-illuminated-type photodiode array for a sensor in which a plurality of photodiode units are arranged two- or one-dimensionally.

2. Description of the Background Art

The field of optical communication has been achieving widespread adoption of the wavelength division multiplexing (WDM) technology, which enables the transmission and reception of a plurality of optical signals having different wavelengths through a single optical fiber. After the separation of the wavelength-multiplexed optical signals, in order to receive individual optical signals having a different wavelength, a plurality of independent photodiodes (PDs) arranged in parallel are sometimes used. For the same purpose, a photodiode array in which a plurality of photodiode units are unified is also used.

In addition, for an optical sensor or image pickup device, a photodiode array is also used in which a plurality of photodiode units are arranged two- or one-dimensionally. In these cases, the suppression of the electrical and optical crosstalk between neighboring photodiode units to a low level is strongly required.

The structure of a conventional photodiode array is explained by referring to FIG. 1. An absorption layer 3, which is either undoped or low-doped with an n-type dopant, and an n-type window layer 4 are epitaxially grown on an n-type substrate 2 in this order. The top surface is masked with a resist layer and then treated by photolithography to form openings arranged one-dimensionally with a constant pitch. A p-type dopant is diffused from above through the openings to form a plurality of p-regions 5. At the same time, pn junctions 6 are formed in the window layer 4 and the absorption layer 3, as shown in FIG. 1. A p-electrode 7 is bonded with ohmic contact to a part of the top surface of each of the p-regions 5. The top faces of the p-regions 5, except the portions for the p-electrodes 7, and the n-type window layer 4 are covered with an antireflective coating 9. A common n-electrode 8 is formed at the rear face of the n-type substrate 2.

FIG. 1 shows an array composed of four unit photodiodes, PD1, PD2, PD3, and PD4. Actually, an array having a different number of unit photodiodes may be used depending on the application, the number being a power of two such as eight or 16. In a practical application, the chip shown in FIG. 1 is mounted on a package and the p-electrodes are wire-bonded with lead pins. Finally, they are sealed to form a completed product. In FIG. 1, the package and the bonding wires are not shown. In the optical communication use, the n-type substrate made of InP is used. In the case of the InP substrate, the absorption layer made of InGaAs in the form of a ternary mixed crystal and the window layer made of InP are used. In many cases, Zn is used as the p-type dopant. The photodiode is classified as an InP-based one, an Si-based one, a GaAs-based one, and so on according to the type of the substrate.

In this example, four signal lightwaves λ1, λ2, λ3, and λ4, each having a different wavelength, enter the corresponding photodiode units PD1, PD2, PD3, and PD4 from above. These signal lightwaves are introduced into this place through an optical fiber, and each signal lightwave is condensed at the surface of a photodiode unit with a condenser lens. The signal lightwave having entered from above produces electron-hole pairs at a depletion layer extending at both sides of the pn junction.

An electric field applied to the depletion layer drives a minority carrier to the pn junction, and then the carrier crosses the pn junction and becomes a majority carrier, producing a photocurrent at the same time. At this moment, when the photodiode array has a continuous structure as shown in FIG. 1, electrical crosstalk may occur. The reason is that because the n-type window layer 4 has an electrical conductivity to a certain extent, a leakage current flows across neighboring photodiode units.

To overcome this problem, a photodiode array as shown in FIG. 2 has been proposed, in which individual photodiodes are isolated by isolation grooves 22. An undoped absorption layer 3 and a p-region 5 are epitaxially grown on an n-type substrate 2. P-electrodes 7 and antireflective coatings 9 are provided on the p-region 5. To isolate the photodiodes, the isolation grooves 22 are formed vertically by etching. Thus, the photodiode units PD1, PD2, PD3, and PD4 are electrically isolated. This structure is expected to prevent the current from flowing across the neighboring photodiodes because the portions of the p-regions are completely isolated. In practical applications, when the inside of the isolation grooves 22 is empty, the pn junction may deteriorate or other problems may be caused. To prevent these problems, the isolation grooves 22 are filled with some material.

The published Japanese patent application Tokukai 2001-144278 has proposed an InP-based photodiode array provided with isolation grooves as shown in FIG. 2. The isolation grooves 22 isolate neighboring unit photodiodes. The side wall of the isolation groove is coated with an insulation film, made of SiN or another material, formed by CVD or another proper method. Thus, the pn junction is protected.

Another published Japanese patent application, Tokukai 2001-352094, has proposed an improvement of an Si-based photodiode array. To isolate photodiodes in the Si-based photodiode array, isolation grooves are formed by etching and subsequently filled with a filling material made of $SiO_2$. This structure is intended to prevent electrical crosstalk between neighboring photodiode units.

In an array in which a plurality of photodiodes are arranged two- or one-dimensionally, various methods are devised to suppress electrical crosstalk between individual photodiodes. An incoming lightwave is introduced through an optical fiber, is condensed with a lens, and enters the unit photodiode perpendicularly in many cases. Consequently, it has been considered that no optical crosstalk occurs. As a result, no conventional designs take the optical crosstalk into account. In actual fact, however, optical crosstalk occurs between neighboring photodiode units.

The optical crosstalk between neighboring photodiode units is explained below by referring to FIG. 3. First, a signal lightwave λ1 enters PD1 at the left-hand side. Although the lightwave is condensed with a condenser lens after emerging from an optical fiber, some components of the lightwave enter the photodiode obliquely to a certain extent. Nearly all of them are absorbed in the absorption layer 3 and produce electron-hole pairs at the depletion layer near the pn junction. Carriers driven by the electric field toward the pn junction cross the pn junction and produce a photocurrent.

In this case, part of them pass through the absorption layer 3 because the layer is thin. The leakage lightwave λ1 having transmitted passes through the n-type substrate 2 and hits the n-electrode 8 at the rear side. Because the n-electrode 8 is metal, the leakage lightwave is reflected from the boundary surface between the n-electrode 8 and the substrate. The reflected lightwave λ1 is absorbed again in the absorption layer 3. In other words, the remaining slight components arrive at the pn junction 6 of the neighboring photodiode and produce electron-hole pairs there, causing PD 2 to produce a photocurrent. The lightwave that has produced the photocurrent is not the intended lightwave entering PD2 from above but the leakage lightwave from the signal lightwave having entered PD1. Because the leakage lightwave from PD1 enters PD2, this phenomenon is optical crosstalk.

Such optical crosstalk cannot be prevented by an isolation groove provided between photodiodes. FIG. 4 shows two unit sections of a photodiode array having isolation grooves (see the foregoing Tokukai 2001-144278 and Tokukai 2001-352094). Nearly all of the components of the lightwave λ1 having entered PD1 are absorbed in the absorption layer 3 and converted into a photocurrent of PD1. However, some of the components pass through the absorption layer 3 and the substrate 2. They are reflected from the n-electrode 8 at the rear side, travel in the substrate 2 upward, and enter the absorption layer 3 and the pn junction 6 of the neighboring PD2. They cause PD2 to produce an additional photocurrent. Even the isolation groove 22 is provided, the reflected lightwave passes through the substrate 2 without being blocked by the isolation groove 22. In other words, the isolation groove 22 cannot prevent the optical crosstalk.

The leakage lightwave may reach not only the neighboring photodiode unit PD2 but also remotely located photodiode units PD3, PD4, and so on. To achieve ohmic contact with the n-type substrate 2, the n-electrode 8 is processed by alloying treatment at high temperature. The heating causes atoms of the n-electrode and the substrate to mutually diffuse. As a result, the boundary surface between the substrate and the electrode is not smooth but undulating. This undulating boundary surface irregularly reflects the leakage lightwave. Consequently, the leakage lightwave may reach photodiode units placed in a considerably remote location. This is the reason why the optical crosstalk is caused.

SUMMARY OF THE INVENTION

An object of the present invention is to prevent optical crosstalk in a photodiode array in which a plurality of photodiode units are arranged two- or one-dimensionally.

The present invention offers a front-illuminated-type photodiode array that is provided with:

(a) a first-electroconductive-type semiconductor substrate;

(b) a first-electroconductive-type electrode placed at the rear-face side of the semiconductor substrate;

(c) a first-electroconductive-type absorption layer that is formed at the front-face side of the semiconductor substrate and that has an absorption edge wavelength of $\lambda_{gr}$;

(d) a plurality of second-electroconductive-type regions formed from the surface of the absorption layer to a certain distance into the absorption layer such that the regions are arranged one- or two-dimensionally;

(e) a second-electroconductive-type electrode provided at a part of each of the second-electroconductive-type regions;

(f) an antireflective coating that covers the top surface other than the individual second-electroconductive-type electrodes and that is for preventing the reflection of an incoming lightwave; and (g) at least one leakage-lightwave-absorbing layer that is provided between the first-electroconductive-type electrode and the absorption layer and that has an absorption edge wavelength, $\lambda_{ga}$, equal to or longer than the absorption edge wavelength, $\lambda_{gr}$, of the absorption layer ($\lambda_{ga} \geq \lambda_{gr}$).

According to the present invention, a leakage-lightwave-absorbing layer having a band gap comparable to or smaller than that of the absorption layer is provided between the rear electrode and the absorption layer. Consequently, an incoming lightwave passes through the leakage-lightwave-absorbing layer before and after being reflected from the rear electrode. That is, it is absorbed by the leakage-lightwave-absorbing layer twice and attenuates. As a result, optical crosstalk can be reduced.

BRIEF DESCRIPTION OF THE DRAWING

In the drawing:

FIG. 11 is a cross-sectional view of the array shown in FIG. 10, in which photodiode units are arranged two-dimensionally.

DETAILED DESCRIPTION OF THE INVENTION

Figure 1:
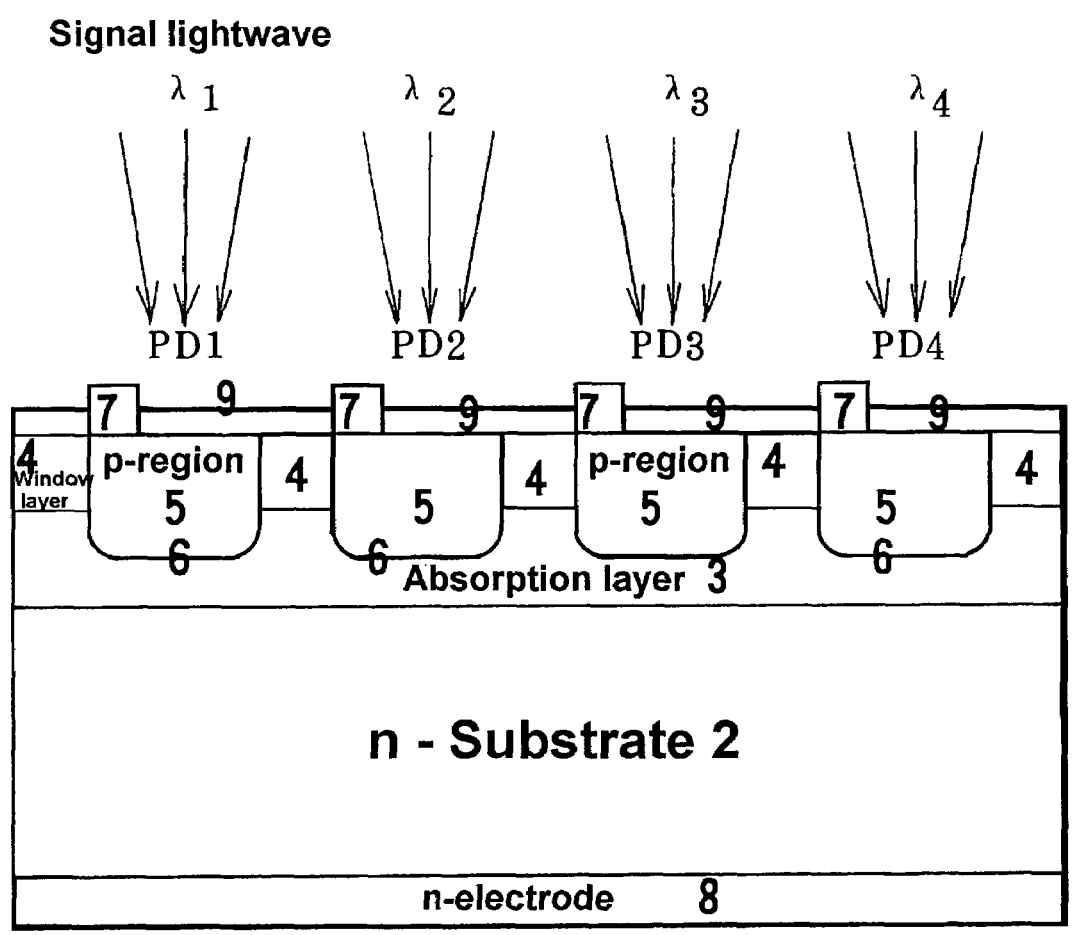
FIG. 1 is a cross-sectional view of a conventional front-illuminated-type photodiode array.
Figure 2:
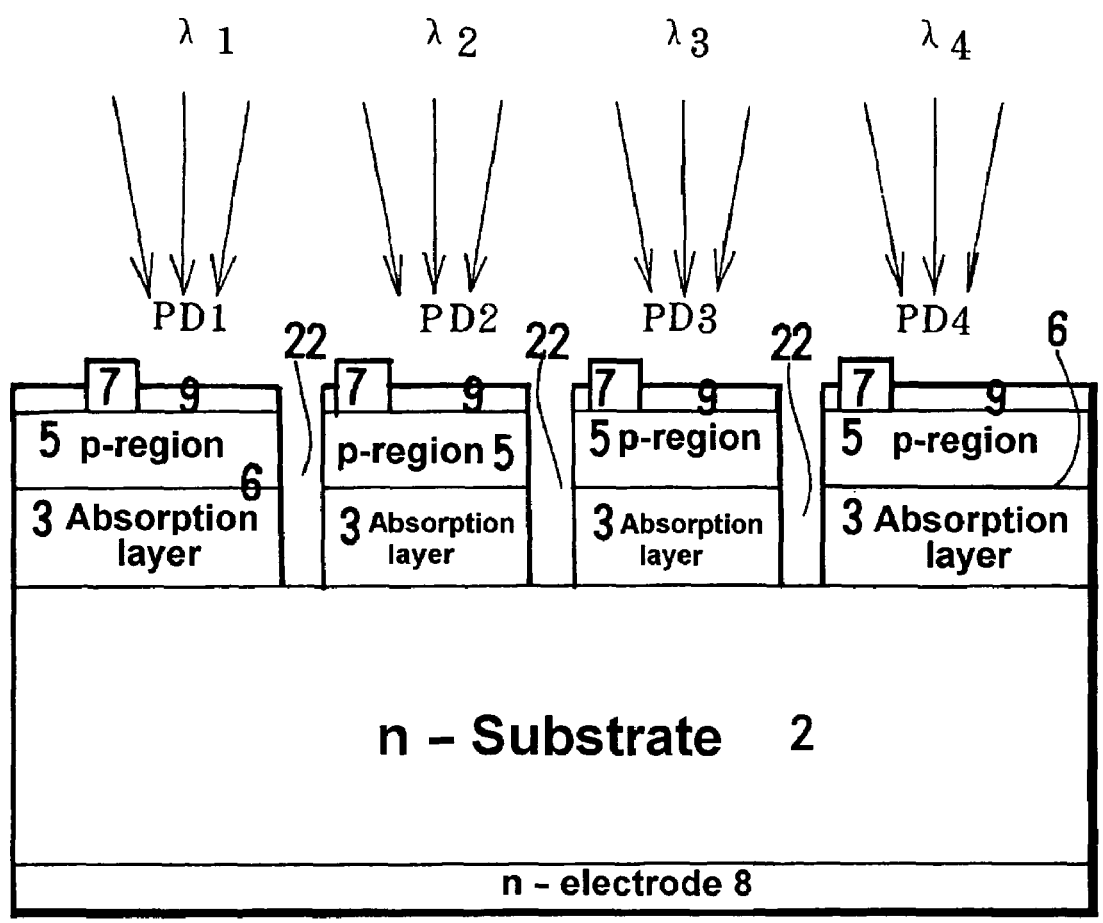
FIG. 2 is a cross-sectional view of another conventional front-illuminated-type photodiode array.
Figure 3:
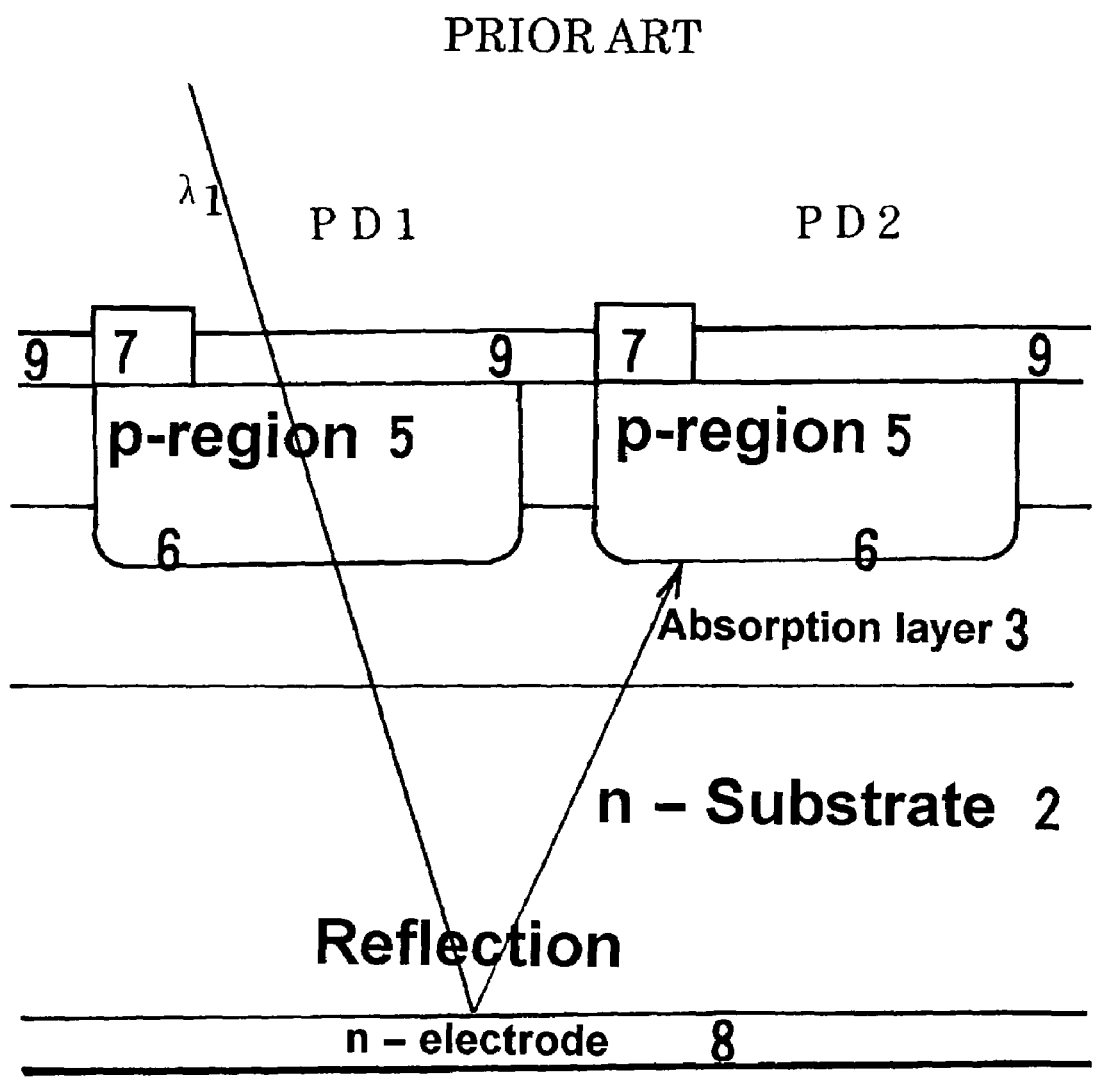
FIG. 3 is a cross-sectional view of a part of the conventional front-illuminated-type photodiode array shown in FIG. 1, the view explaining how a lightwave having entered a photodiode causes optical crosstalk to the neighboring photodiode.
Figure 4:
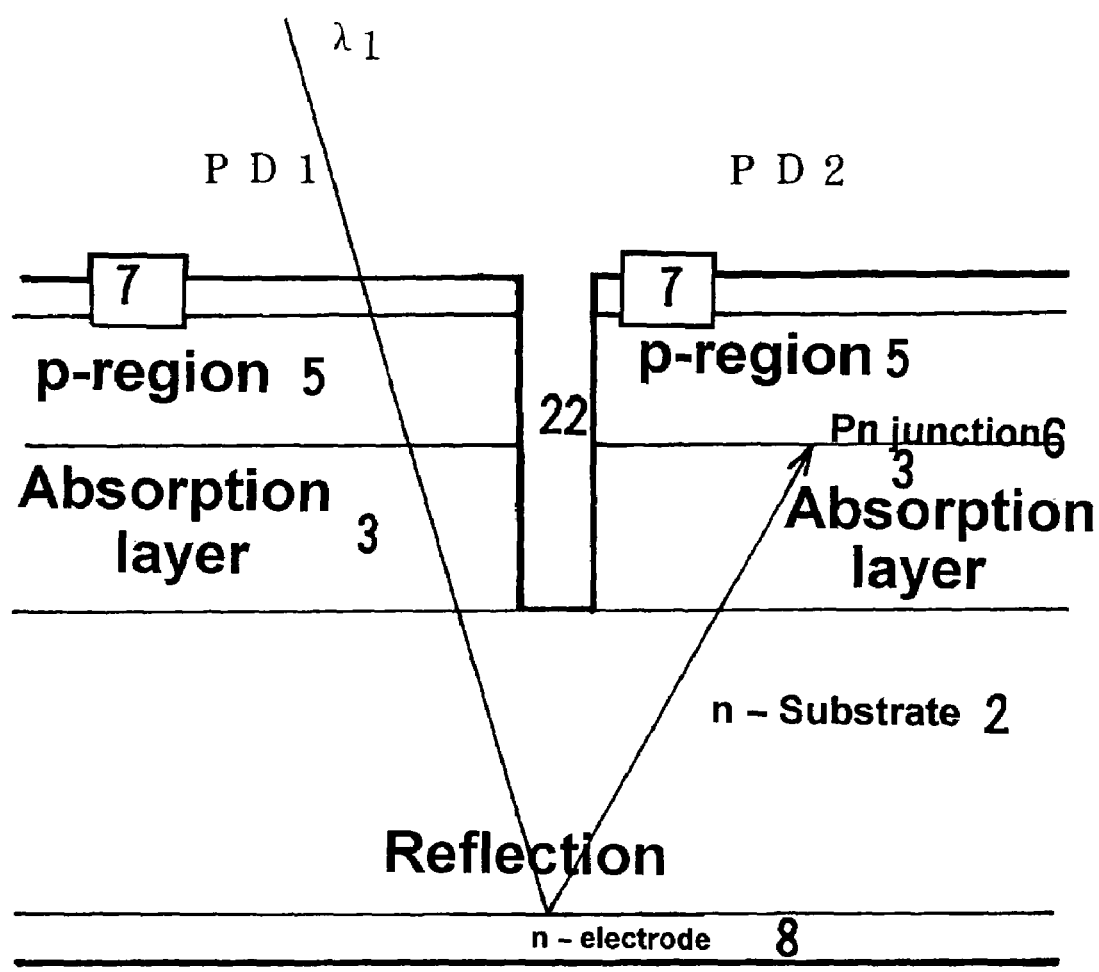
FIG. 4 is a cross-sectional view of a part of the conventional front-illuminated-type photodiode array shown in FIG. 2, the view explaining how a lightwave having entered a photodiode causes optical crosstalk to the neighboring photodiode.

Embodiments of the front-illuminated-type photodiode array of the present invention are explained below in detail by referring to the accompanying drawing. In the drawing, the same reference signs are given to the same elements to avoid duplicated explanations. The ratio of the dimensions in the drawing does not necessarily coincide with the actual ratio.

The photodiode array of the present invention is provided with at least one leakage-lightwave-absorbing layer between the rear electrode and the absorption layer. The at least one leakage-lightwave-absorbing layer is made of a material having a band gap, $E_{ga}$, smaller than the energy ($hc/\lambda$) of the incoming lightwave ($hc/\lambda > E_{ga}$) and is formed by epitaxial growth (here, $\lambda$ means wavelength). Because the band gap is smaller than the energy of the incoming lightwave, the leakage-lightwave-absorbing layer absorbs the incoming lightwave having that wavelength. That is, the leakage-lightwave-absorbing layer absorbs the leakage lightwave to attenuate it. The leakage lightwave travels from the absorption layer to the rear electrode and is reflected from the rear electrode. Therefore, when one leakage-lightwave-absorbing layer is provided between the rear electrode and the absorption layer, the leakage lightwave is absorbed twice. Because it is absorbed two times, it does not reach the neighboring photodiode. Generally, when "m" layers of leakage-lightwave-absorbing layers are provided, the leakage lightwave is absorbed 2m times.

Because the individual energy ($hc/\lambda$) of the individual incoming lightwave ($\lambda$) is known in advance, the minimum energy among them is clear. A leakage-lightwave-absorbing layer is formed by using a material that has a band gap, $E_{ga}$, smaller than the minimum energy and that can be epitaxially grown on the substrate of the photodiodes.

In the case of the optical communication, the individual signal lightwaves entering the individual photodiodes have a slightly different wavelength. Therefore, their energies are slightly different. A material can be selected that has a band gap smaller than these energies and that can be epitaxially grown. When expressed by the band gap, $E_{ga}$, of the leakage-lightwave-absorbing layer, a material is selected that has a property expressed as $E_{ga} < hc/\lambda$, where $\lambda$ is the wavelength of the incoming lightwave. When the same is expressed by using the absorption edge wavelength, $\lambda_{ga}$, because $E_{ga} = hc/\lambda_{ga}$, a leakage-lightwave-absorbing layer may be formed by using a material that has a absorption edge wavelength, $\lambda_{ga}$, satisfying the formula $\lambda < \lambda_{ga}$. That is, the leakage-lightwave-absorbing layer is formed by using a material that has an absorption edge wavelength, $\lambda_{ga}$, longer than the wavelength of the incoming lightwave. Consequently, the leakage-lightwave-absorbing layer may be formed by using a material that has the same composition and the same band gap as those of the material for the absorption layer. The band gap may also be smaller than that of the material for the absorption layer. As described above, it is recommended that the material for the leakage-lightwave-absorbing layer have an absorption edge wavelength longer than the wavelength of the incoming lightwave. However, the wavelength of the lightwave to enter the photodiode is undetermined. That is the reason, in the above description, the material for the leakage-lightwave-absorbing layer is defined in accordance with the absorption edge wavelength, i.e., band gap, of the material for the absorption layer.

Next, the thickness "d" of the leakage-lightwave-absorbing layer is explained below. The purpose of the leakage-lightwave-absorbing layer is to absorb the leakage lightwave. As the thickness increases, the amount of absorption increases. However, if the thickness is excessively large, it is difficult to accomplish the epitaxial growth with good crystallinity. If the leakage-lightwave-absorbing layer has a thickness as large as 10 µm, its crystallinity is impaired. Conversely, if the thickness is excessively small, the amount of absorption is insufficient so that the intended effect cannot be achieved. In the case of an InGaAs- or InGaAsP-based material, as the difference between the intended wavelength $\lambda$ of the incoming lightwave and the absorption edge wavelength $\lambda_{ga}$ increases, the attenuation coefficient $\alpha$ increases. Of course, as the attenuation coefficient $\alpha$ increases, the thickness "d" can be decreased. When $\alpha$ is sufficiently large, "d" of about 1 µm is effective. Depending on $\alpha$, a proper thickness of the leakage-lightwave-absorbing layer is 1 to 5 µm or so.

Because the leakage lightwave passes the leakage-lightwave-absorbing layer twice, when $\alpha$ is known, the amount of attenuation and, therefore, the transmitted power can be calculated.

The leakage-lightwave-absorbing layer can be placed anywhere between the rear electrode and the absorption layer. Consequently, three positions are possible as described below. In addition, the photodiode array is classified into two classes. One is an n-type in which the substrate, absorption layer, and window layer are n-type and the p-region is formed by diffusion or epitaxial growth from above. The other is a p-type in which the substrate, absorption layer, and window layer are p-type and the n-region is formed by diffusion or epitaxial growth from above. It is complicated to describe all of them. Only the n-type photodiode array is used in the explanation below.

Figure 5:
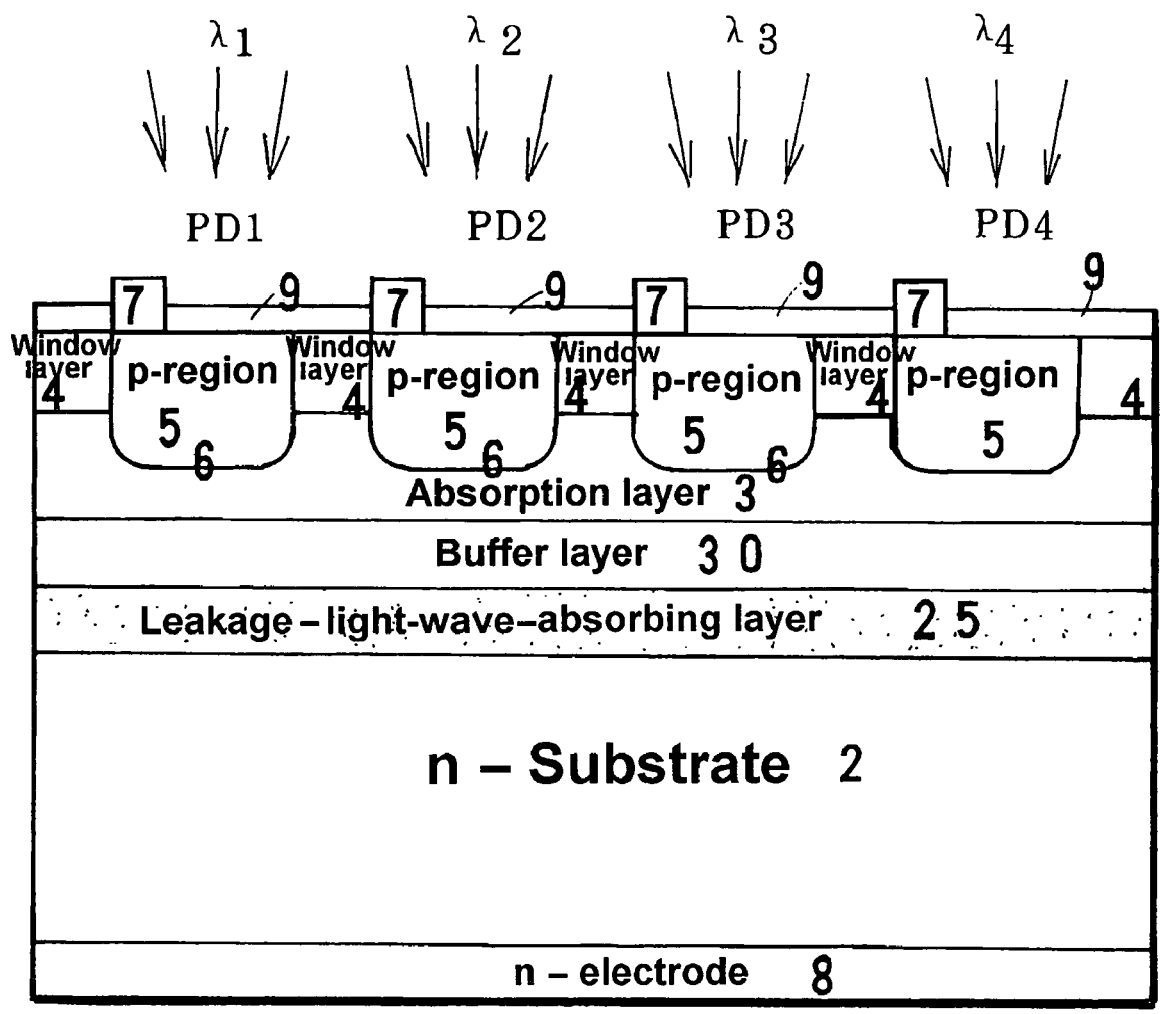
FIG. 5 is a cross-sectional view of an above-type front-illuminated-type photodiode array of the present invention that is provided with a leakage-lightwave-absorbing layer placed at a position above the substrate and below the absorption layer, the leakage-lightwave-absorbing layer having a band gap capable of absorbing an incoming lightwave.
Figure 6:
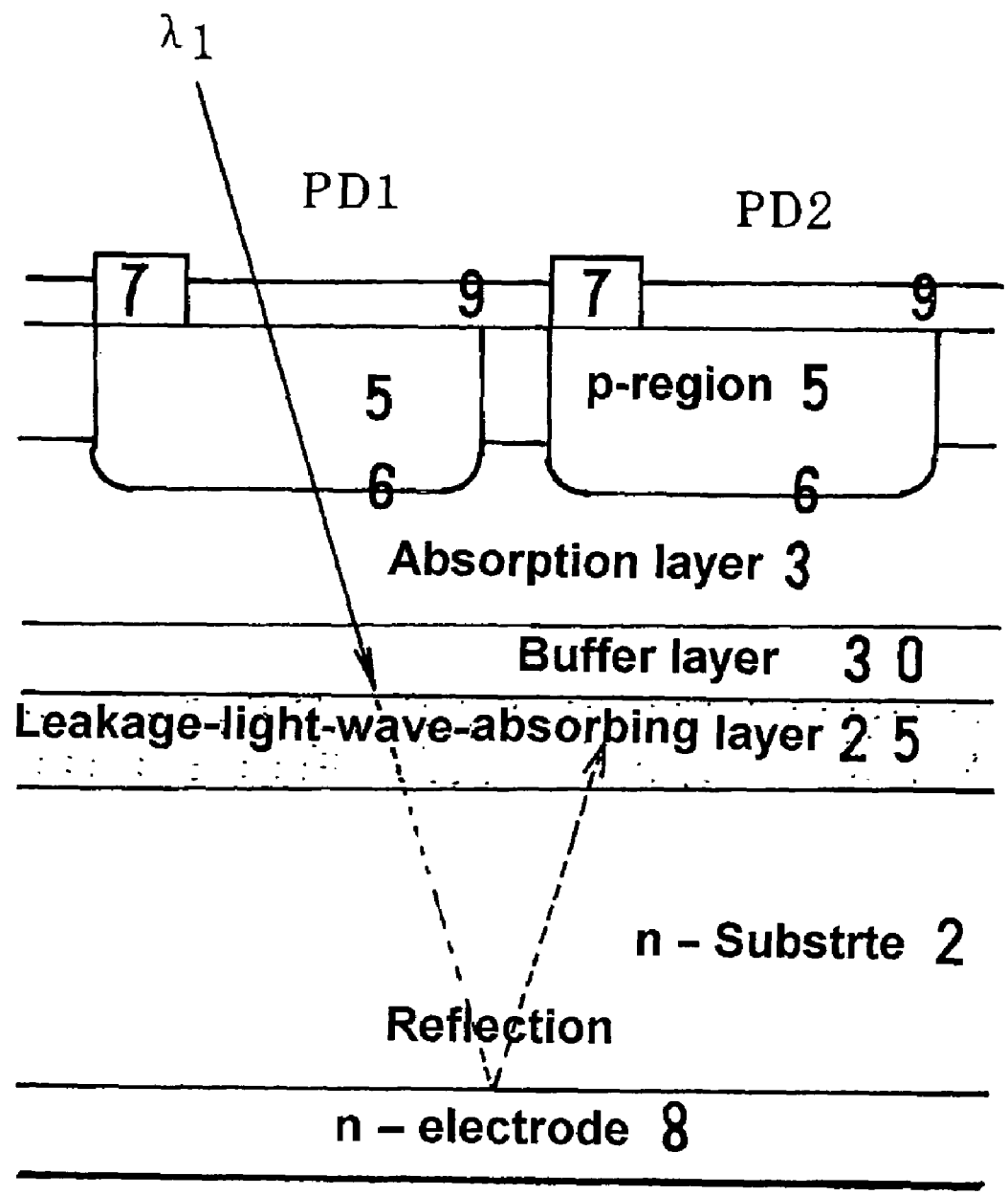
FIG. 6 is a cross-sectional view of an above-type front-illuminated-type photodiode array of the present invention that is provided with a leakage-lightwave-absorbing layer placed at a position above the substrate and below the absorption layer, the view explaining how the optical crosstalk due to a lightwave having entered a photodiode can be suppressed.

(1) Above Type (FIGS. 5 and 6)

In this type, a leakage-lightwave-absorbing layer is placed above the substrate. As shown in FIG. 5, a leakage-lightwave-absorbing layer 25 is placed above the n-type substrate 2. A buffer layer 30, an absorption layer 3, and a window layer 4 are formed on the leakage-lightwave-absorbing layer 25 by epitaxial growth. Then, a p-type dopant is diffused from the top face through a mask made of insulating material. This process forms a required number of p-type regions 5 that penetrate through the window layer 4 and extend into the absorption layer 3 to a certain extent. The boundary between the p-region 5 and the n-type region is a pn junction 6. A p-electrode 7 is bonded with ohmic contact to a part of the top surface of each of the p-regions 5. The top surface other than the individual p-electrodes 7 is covered with an antireflective coating 9. The individual combinations of a p-electrode 7, an antireflective coating 9, a p-region 5, a pn junction 6, a window layer 4, an absorption layer 3, a buffer layer 30, a leakage-lightwave-absorbing layer 25, an n-substrate 2, and an n-electrode 8 form photodiode units PD1, PD2, PD3, and PD4. The n-electrode 8 is attached to the entire rear face of the n-type substrate 2. This is the common n-electrode (cathode).

In the case of an n-type InP-based photodiode array, the array has the following layer structure in this order from above, for example: the p-electrode 7: AuZn; the antireflective coating 9: SiON or SiO$_2$; the p-region 5: Zn-diffused; the window layer 4: n-type InP; the absorption layer 3: n-type InGaAs; the buffer layer 30: n-type InP; the leakage-lightwave-absorbing layer 25: n-type InGaAs; the substrate 2: n-type InP; and the n-electrode 8: AuGeNi. A structure may be employed in which the n-type InP window layer 4 is omitted.

Figure 7:
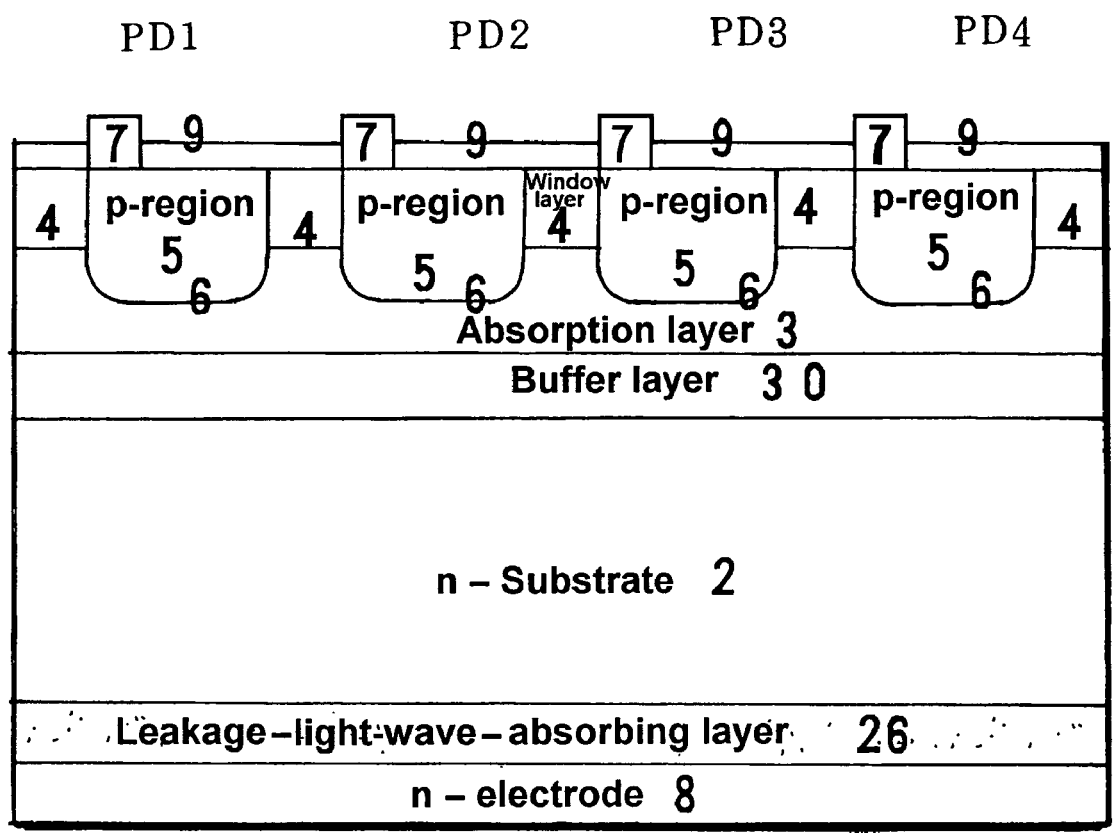
FIG. 7 is a cross-sectional view of a below-type front-illuminated-type photodiode array of the present invention that is provided with a leakage-lightwave-absorbing layer placed below the substrate, the leakage-lightwave-absorbing layer having a band gap capable of absorbing an incoming lightwave.

(2) Below Type (FIG. 7)

In this type, a leakage-lightwave-absorbing layer is placed below the substrate. As shown in FIG. 7, a leakage-lightwave-absorbing layer 26 is formed below the n-type substrate 2 by epitaxial growth. A buffer layer 30, an absorption layer 3, and a window layer 4 are formed on the n-type substrate 2 by epitaxial growth. Then, a p-type dopant is diffused from the top face through a mask made of insulating material. This process forms a required number of p-type regions 5 that penetrate through the window layer 4 and extend into the absorption layer 3 to a certain extent. The boundary between the p-region 5 and the n-type regions 4 and 3 is a pn junction 6. A p-electrode 7 is bonded with ohmic contact to a part of the top surface of each of the p-regions 5. The top surface other than the individual p-electrodes 7 is covered with an antireflective coating 9. The individual combinations of a p-electrode 7, an antireflective coating 9, a p-region 5, a pn junction 6, a window layer 4, an absorption layer 3, a buffer layer 30, an n-substrate 2, a leakage-lightwave-absorbing layer 26, and an n-electrode 8 form photodiode units PD1, PD2, PD3, and PD4. The n-electrode 8 is attached to the entire rear face of the leakage-lightwave-absorbing layer 26 below the n-type substrate 2. This is the common n-electrode (cathode).

In the case of an InP-based photodiode array, the array has the following layer structure in this order from above, for example: the p-electrode 7: AuZn; the antireflective coating 9: SiON or SiO$_2$; the p-region 5: Zn-diffused; the window layer 4: n-type InP; the absorption layer 3: n-type InGaAs; the buffer layer 30: n-type InP; the substrate 2: n-type InP; the leakage-lightwave-absorbing layer 26: n-type InGaAs; and the n-electrode 8: AuGeNi. A structure may be employed in which the n-type InP window layer 4 is omitted.

Figure 8:
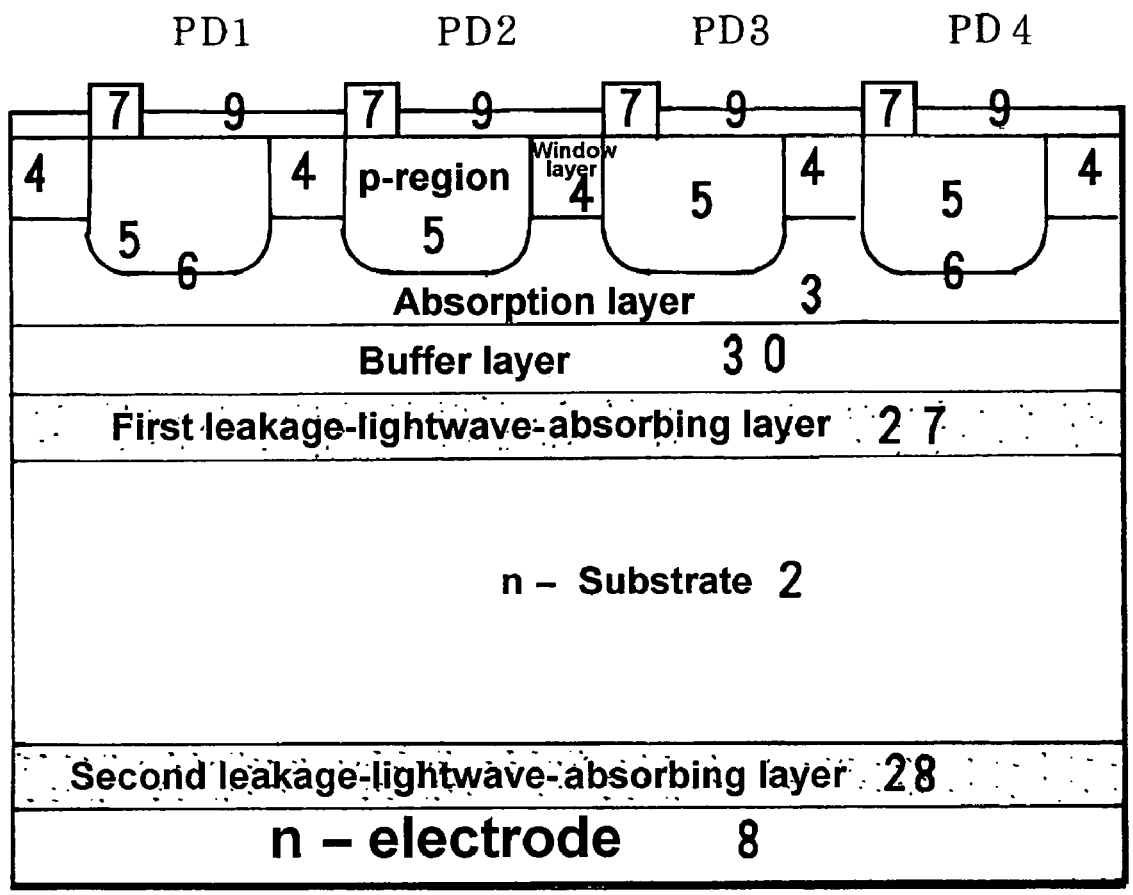
FIG. 8 is a cross-sectional view of an above-and-below-type front-illuminated-type photodiode array of the present invention that is provided with a leakage-lightwave-absorbing layer placed both above and below the substrate, the leakage-lightwave-absorbing layer having a band gap capable of absorbing an incoming lightwave.

(3) Above-and-below Type (FIG. 8)

In this type, a leakage-lightwave-absorbing layer is placed both above and below the substrate. As shown in FIG. 8, a second leakage-lightwave-absorbing layer 28 is formed below the n-type substrate 2 by epitaxial growth. A first leakage-lightwave-absorbing layer 27, a buffer layer 30, an absorption layer 3, and a window layer 4 are formed on the n-type substrate 2 by epitaxial growth. Then, a p-type dopant is diffused from the top face through a mask made of insulating material. This process forms p-type regions 5 that penetrate through the window layer 4 and extend into the absorption layer 3 to a certain extent. The boundary between the p-region 5 and the n-type regions 4 and 3 is a pn junction 6. A p-electrode 7 is bonded with ohmic contact to a part of the top surface of each of the p-regions 5. The top surface other than the individual p-electrodes 7 is covered with an antireflective coating 9. The individual combinations of a p-electrode 7, an antireflective coating 9, a p-region 5, a pn junction 6, a window layer 4, an absorption layer 3, a buffer layer 30, a first leakage-lightwave-absorbing layer 27, an n-substrate 2, a second leakage-lightwave-absorbing layer 28, and an n-electrode 8 form photodiode units PD1, PD2, PD3, and PD4. The n-electrode 8 is attached to the entire rear face of the second leakage-lightwave-absorbing layer 28 below the n-type substrate 2. This is the common n-electrode (cathode).

In the case of an InP-based photodiode array, the array has the following layer structure in this order from above, for example: the p-electrode 7: AuZn; the antireflective coating 9: SiON or SiO$_2$; the p-region 5: Zn-diffused; the window layer 4: n-type InP; the absorption layer 3: n-type InGaAs; the buffer layer 30: n-type InP; the first leakage-lightwave-absorbing layer 27: n-type InGaAs; the substrate 2: n-type InP; the second leakage-lightwave-absorbing layer 28: n-type InGaAs; and the n-electrode 8: AuGeNi. A structure may be employed in which the n-type InP window layer 4 is omitted.

Next, the function of the leakage-lightwave-absorbing layer 25 used in the above-type photodiode array shown in FIG. 5 is explained below by referring to FIG. 6. In this case, a reverse bias voltage is applied such that the n-electrode 8 (cathode) becomes positive and the p-electrode 7 (anode) becomes negative. An n-side depletion layer is formed below the pn junction 6, and a p-side depletion layer is formed above the pn junction 6.

First, a signal lightwave λ1 for PD1 enters PD1. The lightwave λ1 passes through the antireflective coating 9 and the p-region 5 and reaches the depletion layer formed at both sides of the pn junction 6 in the absorption layer 3. Nearly all of the components of the incoming lightwave λ1 are absorbed in the absorption layer 3 because it has a small band gap. Then, electron-hole pairs are produced in the absorption layer. Holes produced principally in the n-side depletion layer travel to the pn junction by the action of the electric field and enter the p-region, producing a photocurrent. However, some of the components of the lightwave λ1 pass through the absorption layer 3 as a leakage lightwave. It passes through the buffer layer 30 without being affected. The leakage lightwave attenuates in the form of exp (−α·s) in the leakage-lightwave-absorbing layer 25 having a small band gap, $E_{ga}$. Here, α is the attenuation coefficient of the leakage-lightwave-absorbing layer 25 and "s" is the coordinate along the path from the top face of the leakage-lightwave-absorbing layer 25. When the slant angle of the light beam is expressed as Y, the thickness $d_a$ of the leakage-lightwave-absorbing layer 25 increases effectively to $d_a$·sec Y. Consequently, when the leakage lightwave passes through the leakage-lightwave-absorbing layer 25, it attenuates to exp (−α·$d_a$·sec Y). Because the substrate 2 has a large band gap, practically no absorption occurs there. The leakage lightwave passes through the substrate 2 without being affected and hits the n-electrode 8 at the rear side. The leakage lightwave is reflected irregularly from the n-electrode 8, and part of it travels toward the neighboring photodiodes PD2, PD3, and so on. The reflected leakage lightwave passes through the substrate 2 without being affected and is forced to pass the leakage-lightwave-absorbing layer 25 again. As with the foregoing case, it attenuates to exp (−α·$d_a$·sec Y'). Because it is irregularly reflected, Y' is not necessarily equal to Y. In total, the leakage lightwave attenuates to exp (−α·$d_a$·sec Y−α·$d_a$·secY') due to the presence of the leakage-lightwave-absorbing layer 25. Therefore, practically no leakage lightwave reaches the pn junction 6 of the neighboring photodiodes PD2 and PD3. This structure can achieve an extinction ratio of about 1/1,000.

Optical crosstalk can also be prevented similarly in the below-type array shown in FIG. 7 in which a leakage-lightwave-absorbing layer is placed below the substrate. It is assumed that a lightwave having entered PD1 is not completely absorbed in the absorption layer 3 in the vicinity of the pn junction 6. The leakage lightwave passes through the n-type substrate 2 and reaches the leakage-lightwave-absorbing layer 26 having a thickness of $d_a$. Because the leakage-lightwave-absorbing layer 26 has a band gap smaller than the energy of the incoming lightwave, the leakage lightwave attenuates also in the form of exp ($-\alpha \cdot s$). Here, $\alpha$ is the attenuation coefficient of the leakage-lightwave-absorbing layer 26. Then, the leakage lightwave is reflected from the n-electrode 8 in a direction of Y' and travels upward obliquely. It is absorbed again by the leakage-lightwave-absorbing layer 26 directly above. As with the foregoing example, the leakage lightwave passes through the leakage-lightwave-absorbing layer 26 both from top to bottom and from bottom to top and accordingly attenuates twice. In total, it attenuates to exp ($-\alpha \cdot d_a \cdot \sec Y - \alpha \cdot d_a \cdot \sec Y'$). As a result, the optical crosstalk between neighboring photodiode units can be suppressed to $-30$ dB or so.

In the above-and-below-type array shown in FIG. 8 in which a leakage-lightwave-absorbing layer is placed both above and below the substrate, optical crosstalk can be prevented more effectively. It is assumed that a lightwave having entered PD1 is not completely absorbed in the absorption layer 3 in the vicinity of the pn junction 6. The leakage lightwave is absorbed in the first leakage-lightwave-absorbing layer 27 directly below the buffer layer 30. The first leakage-lightwave-absorbing layer 27 has a small band gap and a thickness of $d_{a1}$. The leakage lightwave attenuates in the form of exp ($-\alpha_1 s$). Here, $\alpha_1$ is the attenuation coefficient of the first leakage-lightwave-absorbing layer 27. The attenuated leakage lightwave having passed through the first leakage-lightwave-absorbing layer 27 passes through the n-type substrate 2 and reaches the second leakage-lightwave-absorbing layer 28 having a thickness of $d_{a2}$. Because the second leakage-lightwave-absorbing layer 28 also has a band gap smaller than the energy of the incoming lightwave, the leakage lightwave attenuates also in the form of exp ($-\alpha_2 s$). Here, $\alpha_2$ is the attenuation coefficient of the second leakage-lightwave-absorbing layer 28. Then, the leakage lightwave is reflected from the n-electrode 8 and travels upward obliquely. It is absorbed again by the second leakage-lightwave-absorbing layer 28 directly above. As with the foregoing example, the leakage lightwave passes through the second leakage-lightwave-absorbing layer 28 both from top to bottom and from bottom to top and accordingly attenuates twice. This type of array combines the functions of the above type and the below type. Consequently, in total, the leakage lightwave attenuates to exp$\{-(\alpha_1 \cdot d_{a1} + \alpha_2 \cdot d_{a2})(\sec Y + \sec Y')\}$. As a result, the optical crosstalk between neighboring photodiode units can be suppressed to $-60$ dB or so, for example. The attenuation coefficient a depends on the wavelength of the incoming lightwave. Therefore, a different wavelength produces a different attenuation in crosstalk. As the wavelength $\lambda$ of the incoming lightwave decreases, the attenuation increases and consequently the present invention increases its effectiveness.

For example, it is assumed that an array having four photodiode units is produced by the following procedure. An InGaAs leakage-lightwave-absorbing layer having a thickness of 3 μm is formed on an n-type InP substrate. An InP buffer layer having a thickness of 2 μm, an InGaAs absorption layer having a thickness of 4 μm, and an InP window layer having a thickness of 1.5 μm are grown epitaxially on the leakage-lightwave-absorbing layer. A mask made of SiN is applied to diffuse Zn. Finally, electrodes and an antireflective coating are provided.

In this case, when a signal lightwave having a wavelength of 1.3 μm enters PD1 from above, the percentage of the lightwave entering the neighboring photodiode unit PD2 is 0.00023% at the maximum. This result is obtained through the following process. The summation of the thickness of the absorption layer ($d_r=4$ μm) and two times the thickness of the leakage-lightwave-absorbing layer ($d_a=3$ μm) is 10 μm ($2d_a+d_r$). The attenuation coefficient $\alpha$ is 1.3 μm$^{-1}$. Therefore, $\exp\{-\alpha(2d_a+d_r)\}=\exp(-1.3\times10)=2.3\times10^{-6}$ is obtained. The resultant power of the leakage lightwave is extremely small.

Another calculation is given below. When a signal lightwave having a wavelength of 1.55 μm enters PD1 from above, the percentage of the lightwave entering the neighboring photodiode unit PD2 is 0.09% at the maximum. This result is obtained through the following process similar to the above. The summation of the thickness of the absorption layer ($d_r=4$ μm) and two times the thickness of the leakage-lightwave-absorbing layer ($d_a=3$ μm) is 10 μm ($2d_a+d_r$). The attenuation coefficient $\alpha$ is 0.7 μm$^{-1}$. Therefore, $\exp\{-\alpha(2d_a+d_r)\}=\exp(-0.7\times10)=9\times10^{-4}$ is obtained. The resultant power of the leakage lightwave is also small.

In actuality, most of the lightwave having entered PD1 and having been reflected from the rear electrode is bound to return to PD1. Consequently, the leakage lightwave that enters PD2 has a power much weaker than the power obtained by the above calculations. In addition, because the direction of the light beam is slanted against the leakage-lightwave-absorbing layer, the effective layer thickness increases form "d" to d·sec Y. Accordingly, the leakage lightwave attenuates further.

In the case of the combination of an InP substrate and an InGaAs absorption layer, the signal lightwave has a wavelength of 1.3 to 1.55 μm in many cases. In this case, it is recommended that a leakage-lightwave-absorbing layer be used that is made of a ternary mixed crystal of InGaAs and that has an absorption edge wavelength of about 1.6 μm.

EXAMPLE 1

One-dimensionally Arranged Photodiode Array
(Above Type: M×1)

Figure 9:
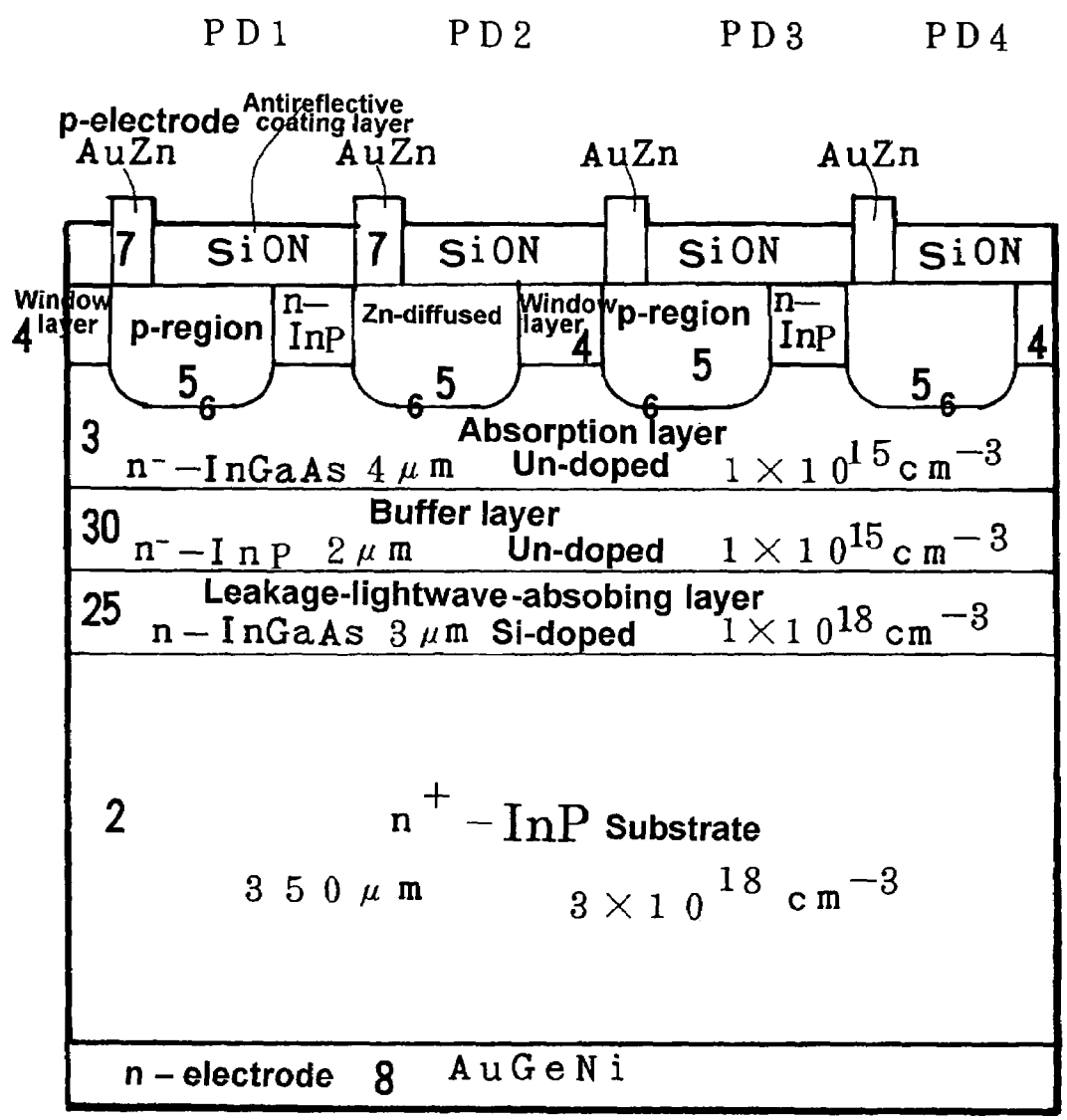
FIG. 9 is a cross-sectional view showing the structure of Example 1 of an above-type front-illuminated-type photodiode array that is provided with a leakage-lightwave-absorbing layer placed above the substrate.

An embodiment of an above-type photodiode array of the present invention that has a leakage-lightwave-absorbing layer provided above the substrate (see FIG. 5) is explained below by referring to FIG. 9. Although FIG. 9 shows an array having four unit photodiodes, the number of unit photodiodes may be increased. When an array has a specific number of photodiode units such that the number is expressed as a power of two such as eight, 16, 32, and so on, the array is suitable for a receiving section of optical communication. It is recommended that the pitch of the arrangement be either the same as the diameter of the cladding of the optical fiber (125 μm) or an integral multiple of the diameter. For an optical sensor in which a plurality of photodiode units are arranged one-dimensionally, both the number of photodiode units M and the pitch P can be determined freely in accordance with the purpose.

In Example 1, the following layers were epitaxially grown by the metalorganic vapor phase epitaxial (MOVPE) method in the following order on an n-type InP substrate 2 that had a thickness of 350 μm and that was doped with sulfur ($n=3\times10^{18}$ cm$^{-3}$):

an n-type InGaAs leakage-lightwave-absorbing layer 25 (thickness: 3 μm, Si-doped, and $n=1\times10^{18}$ cm$^{-3}$), the leakage-lightwave-absorbing layer having the same absorption edge wavelength as that of the below-described absorption layer;

an n-type InP buffer layer 30 (thickness: 2 μm, undoped, and n=1×10$^{15}$ cm$^{-3}$);

an n-type InGaAs absorption layer 3 (thickness: 4 μm, undoped, n=1×10$^{15}$ cm$^{-3}$, and lattice-matched with the InP); and an InP window layer 4 (thickness: 1.5 μm, undoped, and n=1×10$^{15}$ cm$^{-3}$).

Triethylgallium (TEG), trimethylindium (TMI), arsin (AsH$_3$), and phosphine (PH$_3$) were used as the material gas for the epitaxial growth.

A monosilane (SiH$_4$) gas was used as the material including Si as the n-type dopant. In the epitaxial growth process, the pressure was 40 Torr (5.32×10$^3$ Pa) and the temperature was 650° C.

Pn junctions 6 were formed by the following process. First, an SiN$_x$ film was formed on the InP window layer. Through holes were formed in the film with a constant pitch. The film provided with the holes was used as a mask. Then, Zn was selectively diffused through the holes to form the pn junctions.

An antireflective coating 9 was formed of SiON. P-electrodes were formed of AuZn. An n-electrode was formed of AuGeNi.

The chip was mounted on a package, wire bonding was performed, and finally sealing was conducted. Thus, a four-photodiode array was produced that incorporated PD1, PD2, PD3, and PD4.

The sensitivity was measured by introducing a 1.55-μm lightwave into only the first photodiode PD1 at a nearly perpendicular angle. The result showed that the sensitivity of PD1 was 1 A/W. The neighboring second photodiode PD2 showed a sensitivity of less than 0.001 A/W. In other words, the leakage lightwave from PD1 to PD2 was extremely weak and its power was less than about 1/1,000 that of the lightwave introduced into PD1.

Next, a 1.55-μm lightwave was introduced into the first photodiode PD1 at a slanting angle so that the leakage lightwave could be easily reflected from the boundary between the rear electrode and the substrate. The introduced lightwave was expected to be reflected from the boundary and enter PD2. Nevertheless, the sensitivity of PD2 was less than 0.001 A/W. The sensitivity of PD3 and PD4 was much smaller.

As described above, the present invention achieved an extinction ratio of 1/1,000 (−30 dB) by providing a leakage-lightwave-absorbing layer between the substrate and the absorption layer.

EXAMPLE 2

Two-dimensionally Arranged Photodiode Array
(Above Type: M×N)

Figure 10:
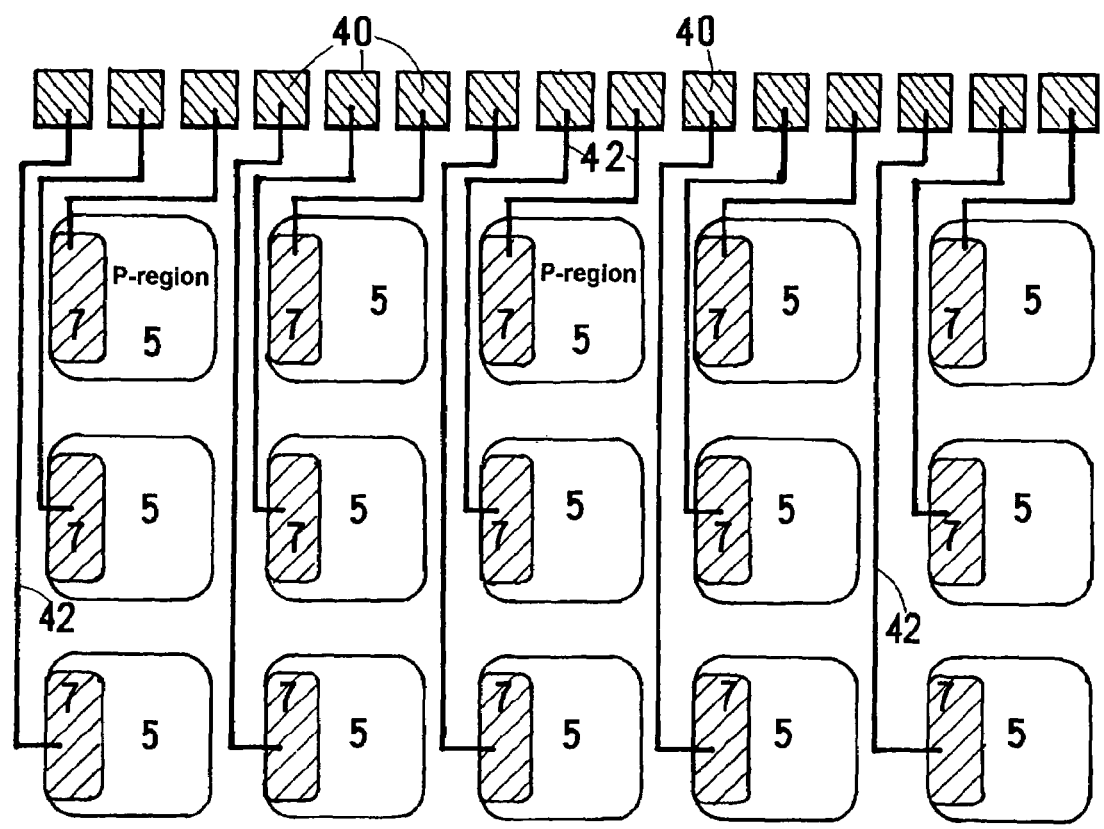
FIG. 10 is a plan view of the front-illuminated-type photodiode array shown as Example 2 of the present invention in which photodiode units are arranged two-dimensionally.

The present invention can also be applied to a front-illuminated-type two-dimensionally arranged photodiode array. FIG. 10 shows a partial plan view of it, and FIG. 11 a partial cross-sectional view of it. This array is formed by arranging photodiode units, "M×N" in number, on one chip. When viewed from above, p-regions 5 and p-electrodes 7 are arranged in rows and columns. Actually, the top surface is covered with an antireflective coating 9 and the p-electrodes 7 complementarily. A number of electrode pads 40 connected to the p-electrodes are provided at one, two, three, or four sides of the chip. The electrode pads 40 are connected through wires 42 to the p-electrodes 7 of the individual photodiode units. An n-electrode 8 is common and placed at the rear side of the chip. Consequently, it is bonded to a stem of a package. The electrode pads 40 are connected to pins of the package by wire bonding.

As shown in FIG. 11, a leakage-lightwave-absorbing layer 25 having a band gap smaller than the energy of the incoming lightwave is provided between the substrate 2 and the absorption layer 3. Because the leakage-lightwave-absorbing layer 25 absorbs the leakage lightwave twice, the optical crosstalk between photodiodes can be decreased.

The wires 42 are provided on the top surface of the chip. As the number "M ×N" increases, the number of wires increases. Accordingly, the area of the top surface for the wiring increases, decreasing the area of the photodiodes for introducing signal lightwaves. On the other hand, this increases the spacing between photodiode units. This is advantageous in decreasing the optical crosstalk.

What is claimed is:

1. A front-illuminated-type photodiode array comprising:
   (a) a first-electroconductive-type semiconductor substrate;
   (b) a first-electroconductive-type electrode placed at the rear-face side of the semiconductor substrate;
   (c) a first-electroconductive-type absorption layer that:
      (c1) is formed at the front-face side of the semiconductor substrate; and
      (c2) has an absorption edge wavelength of $\lambda_{gr}$;
   (d) a plurality of lightwave receiving parts comprising:
      (d1) a plurality of second-electroconductive-type regions formed from the surface of the absorption layer to a certain distance into the absorption layer such that the regions are arranged one- or two-dimensionally; and
      (d2) a second-electroconductive-type electrode provided at a part of each of the second-electroconductive-type regions;
   (e) an antireflective coating that:
      (e1) covers the top surface other than the individual second-electroconductive-type electrodes; and
      (e2) is for preventing the reflection of an incoming lightwave;
   (f) at least one first-electroconductive-type leakage-lightwave-absorbing layer that:
      (f1) is provided between the first-electroconductive-type electrode and the absorption layer; and
      (f2) has an absorption edge wavelength, $\lambda_{ga}$, equal to or longer than the absorption edge wavelength, $\lambda_{gr}$, of the absorption layer ($\lambda_{ga} \geq \lambda_{gr}$); and
   (g) a first-electroconductive-type buffer layer that:
      (g1) is provided between the absorption layer and the at least one leakage-lightwave-absorbing layer; and
      (g2) has an absorption edge wavelength, $\lambda_{gb}$, shorter than the absorption edge wavelength, $\lambda_{gr}$, of the absorption layer ($\lambda_{gb} < \lambda_{gr}$).

2. A front-illuminated-type photodiode array as defined by claim 1, the array further comprising a window layer that:
   (a) is provided on the absorption layer; and
   (b) has an absorption edge wavelength, $\lambda_{gw}$, shorter than the absorption edge wavelength, $\lambda_{gr}$, of the absorption layer ($\lambda_{gw} < \lambda_{gr}$);
the second-electroconductive-type regions penetrating through the window layer.

3. A front-illuminated-type photodiode array as defined by claim 1, the array further comprising a window layer that:
   (a) is provided on the absorption layer; and (b) has an absorption edge wavelength, $\lambda_{gw}$, shorter than the absorption edge wavelength, $\lambda_{gr}$, of the absorption layer ($\lambda_{gw} < \lambda_{gr}$);

the second-electroconductive-type regions penetrating through the window layer.

4. A front-illuminated-type photodiode array as defined by claim 3, wherein the at least one leakage-lightwave-absorbing layer, the buffer layer, the absorption layer, and the window layer are formed on the semiconductor substrate by epitaxial growth.

5. A front-illuminated-type photodiode array comprising:
(a) an n-type InP substrate;
(b) a common n-electrode provided at the rear side of the n-type InP substrate;
(c) an n-type InGaAs leakage-lightwave-absorbing layer epitaxially grown at the front side of the n-type InP substrate;
(d) an n-type InP buffer layer epitaxially grown on the n-type InGaAs leakage-lightwave-absorbing layer;
(e) an n-type InGaAs absorption layer epitaxially grown on the n-type InP buffer layer;
(f) an n-type InP window layer epitaxially grown on the n-type InGaAs absorption layer;
(g) a plurality of p-regions that:
(g1) are formed so as to penetrate through the n-type InP window layer and extend into the n-type InGaAs absorption layer to a certain extent; and
(g2) are arranged one- or two-dimensionally;
(h) a p-electrode provided at a part of each of the top faces of the p-regions; and
(i) an antireflective coating that covers the top surface other than the individual p-electrodes;

the n-type InGaAs leakage-lightwave-absorbing layer having an absorption edge wavelength equal to or longer than that of the n-type InGaAs absorption layer.

6. A front-illuminated-type photodiode array comprising:
(a) an n-type InP substrate;
(b) a common n-electrode provided at the rear side of the n-type InP substrate;
(c) an n-type InGaAs leakage-lightwave-absorbing layer epitaxially grown at the front side of the n-type InP substrate;
(d) an n-type InP buffer layer epitaxially grown on the n-type InGaAs leakage-lightwave-absorbing layer;
(e) an n-type InGaAs absorption layer epitaxially grown on the n-type InP buffer layer;
(f) a plurality of p-regions that:
(f1) are formed from the surface of the n-type InGaAs absorption layer to a certain distance into the absorption layer; and
(f2) are arranged one- or two-dimensionally;
(g) a p-electrode provided at a part of each of the top faces of the p-regions; and
(h) an antireflective coating that covers the top surface other than the individual p-electrodes;

the n-type InGaAs leakage-lightwave-absorbing layer having an absorption edge wavelength equal to or longer than that of the n-type InGaAs absorption layer.

* * * * *

UNITED STATES PATENT AND TRADEMARK OFFICE
CERTIFICATE OF CORRECTION

PATENT NO. : 7,274,081 B2 Page 1 of 1
APPLICATION NO. : 11/072572
DATED : September 25, 2007
INVENTOR(S) : Yasuhiro Iguchi It is certified that error appears in the above-identified patent and that said Letters Patent is hereby corrected as shown below:

Col. 12, claim 1, line 49, "$\lambda_{ga\gamma}$" should be --$\lambda_{ga}$--.

Signed and Sealed this

Fifteenth Day of April, 2008

JON W. DUDAS
*Director of the United States Patent and Trademark Office*